(12) United States Patent
Shimizu

(10) Patent No.: US 11,015,264 B2
(45) Date of Patent: May 25, 2021

(54) DIAMOND SUBSTRATE, QUANTUM DEVICE, QUANTUM SYSTEM, AND METHOD FOR MANUFACTURING DIAMOND SUBSTRATE

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 68 days.

(21) Appl. No.: 16/270,804

(22) Filed: Feb. 8, 2019

(65) Prior Publication Data
US 2020/0087817 A1    Mar. 19, 2020

(30) Foreign Application Priority Data
Sep. 14, 2018 (JP) .............. JP2018-173111

(51) Int. Cl.
| | | |
|---|---|---|
| *C30B 29/04* | (2006.01) | |
| *C30B 25/02* | (2006.01) | |
| *C23C 16/56* | (2006.01) | |
| *C23C 16/27* | (2006.01) | |
| *C23C 16/40* | (2006.01) | |
| *C30B 33/02* | (2006.01) | |

(52) U.S. Cl.
CPC .............. *C30B 29/04* (2013.01); *C23C 16/27* (2013.01); *C23C 16/401* (2013.01); *C23C 16/56* (2013.01); *C30B 25/02* (2013.01); *C30B 33/02* (2013.01)

(58) Field of Classification Search
CPC ................. C23C 16/27; C30B 29/04
USPC .......................................... 428/408
See application file for complete search history.

(56) References Cited

U.S. PATENT DOCUMENTS

| | | | |
|---|---|---|---|
| 9,324,826 B2 | 4/2016 | Shimizu et al. | |
| 2008/0169814 A1* | 7/2008 | Munson .............. | G01R 33/307 324/321 |
| 2009/0142249 A1* | 6/2009 | Meguro .................. | C30B 25/02 423/446 |

(Continued)

FOREIGN PATENT DOCUMENTS

| | | | |
|---|---|---|---|
| JP | 01-103993 | * | 4/1989 |
| JP | 2012-164788 | | 8/2012 |

(Continued)

OTHER PUBLICATIONS

Fukui, T., et al. "Perfect selective alignment of nitrogen-vacancy centers in diamond", Applied Physics Express 7, 055201, 2014, 5 pages.

(Continued)

*Primary Examiner* — Archene A Turner
(74) *Attorney, Agent, or Firm* — Oblon, McClelland, Maier & Neustadt, L.L.P.

(57) ABSTRACT

A diamond substrate according to an embodiment includes a diamond layer including at least one first element selected from the group consisting of nitrogen (N), phosphorus (P), arsenic (As), antimony (Sb), and bismuth (Bi), the number of threefold coordinated atoms of the at least one first element in the diamond layer being larger than the number of fourfold coordinated atoms of the at least one first element in the diamond layer, a surface of the diamond layer having an off angle of 10 degrees or less with respect to a (111) face.

16 Claims, 11 Drawing Sheets

(56) References Cited

U.S. PATENT DOCUMENTS

2009/0308305 A1* 12/2009 Mokuno .......... H01L 21/02376
                                                 117/108
2012/0199846 A1   8/2012 Shimizu et al.
2013/0143022 A1*  6/2013 Schreck ............... C23C 16/279
                                                 428/408
2016/0334474 A1* 11/2016 Hatano ............... G01R 33/032

FOREIGN PATENT DOCUMENTS

| JP | 2014-78727 | | 5/2014 |
|---|---|---|---|
| JP | 5524103 | | 6/2014 |
| JP | 2015-146450 | | 8/2015 |
| JP | 5763154 | | 8/2015 |
| JP | 6072122 | | 2/2017 |
| KR | 2008-0090508 | * | 10/2008 |
| WO | 2015/107907 A1 | | 7/2015 |

OTHER PUBLICATIONS

Tahara, K., et al. "Quantifying selective alignment of ensemble nitrogen-vacancy centers in (111) diamond", Applied Physics Letters 107, 193110, 2015, 5 pages.

* cited by examiner

DIAMOND SUBSTRATE, QUANTUM DEVICE, QUANTUM SYSTEM, AND METHOD FOR MANUFACTURING DIAMOND SUBSTRATE

CROSS-REFERENCE TO RELATED APPLICATION

This application is based upon and claims the benefit of priority from Japanese Patent Application No. 2018-173111, filed on Sep. 14, 2018, the entire contents of which are incorporated herein by reference.

FIELD

Embodiments described herein relate generally to a diamond substrate, a quantum device, a quantum system, and a method for manufacturing a diamond substrate.

BACKGROUND

A nitrogen-vacancy center (hereinafter, referred to as a NV center) of diamond is a complex defect in which nitrogen enters a lattice point of carbon in a diamond crystal and a vacancy is present at a position adjacent to the nitrogen. It has been examined that the NV center is applied to a quantum device, such as a quantum computer, a quantum information device, or a quantum sensor, or a quantum system using the spin of the NV center or the optical characteristics of the NV center.

It is necessary to increase the density of the NV centers in diamond in order to apply the NV center to the quantum device or the quantum system. Therefore, it is desirable to achieve a high-quality diamond substrate in which the density of the NV centers in diamond is high.

DETAILED DESCRIPTION

Figure 1:
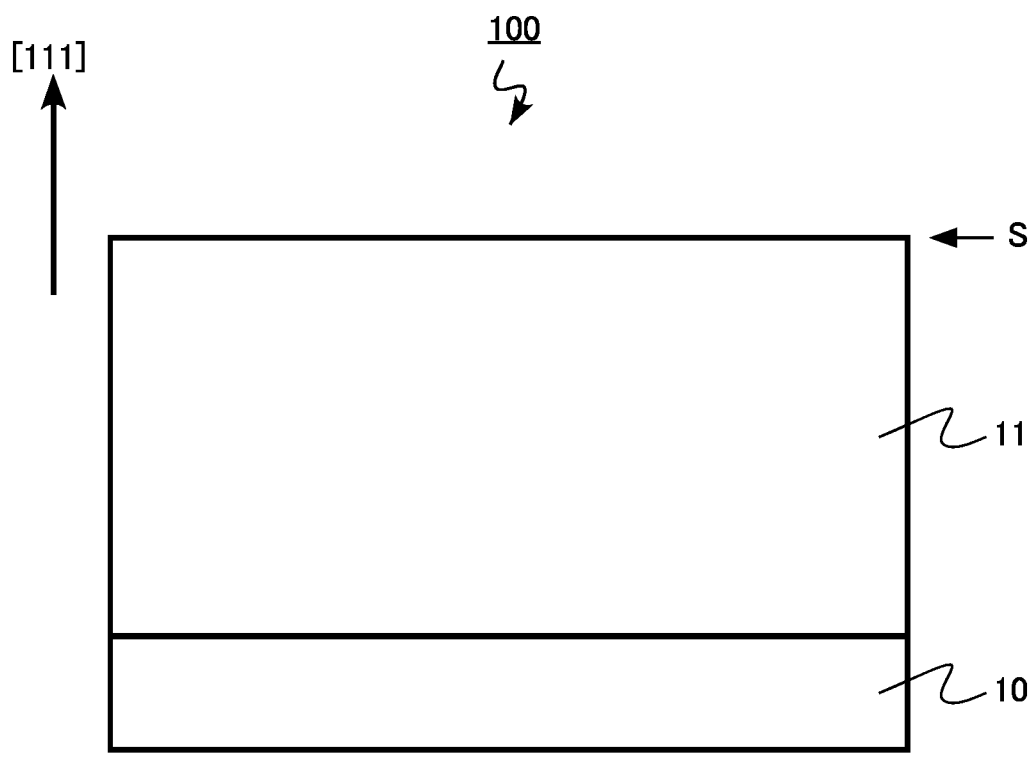
FIG. 1 is a cross-sectional view schematically illustrating a diamond substrate according to a first embodiment.

A diamond substrate according to an embodiment includes a diamond layer including at least one first element selected from the group consisting of nitrogen (N), phosphorus (P), arsenic (As), antimony (Sb), and bismuth (Bi), the number of threefold coordinated atoms of the at least one first element in the diamond layer being larger than the number of fourfold coordinated atoms of the at least one first element in the diamond layer, a surface of the diamond layer having an off angle of 10 degrees or less with respect to a (111) face.

Hereinafter, embodiments will be described with reference to the drawings. In the following description, for example, the same or similar members are denoted by the same reference numerals and the description of the members that have been described once will not be repeated.

First Embodiment

A diamond substrate according to a first embodiment includes a diamond layer including at least one first element selected from the group consisting of nitrogen (N), phosphorus (P), arsenic (As), antimony (Sb), and bismuth (Bi), the number of threefold coordinated atoms of the at least one first element in the diamond layer being larger than the number of fourfold coordinated atoms of the at least one first element in the diamond layer, a surface of the diamond layer having an off angle of 10 degrees or less with respect to a (111) face.

FIG. 1 is a cross-sectional view schematically illustrating the diamond substrate according to the first embodiment. A diamond substrate 100 according to the first embodiment includes a base layer 10 (substrate) and a diamond layer 11.

The base layer 10 is made of single crystal diamond.

The diamond layer 11 is made of single crystal diamond. An off angle between a surface S of the diamond layer 11 and a (111) face is equal to or less than 10 degrees. The (111) face has a [111] direction as a normal line.

Next, a case in which the first element is nitrogen (N) will be described as an example.

Figure 2A:
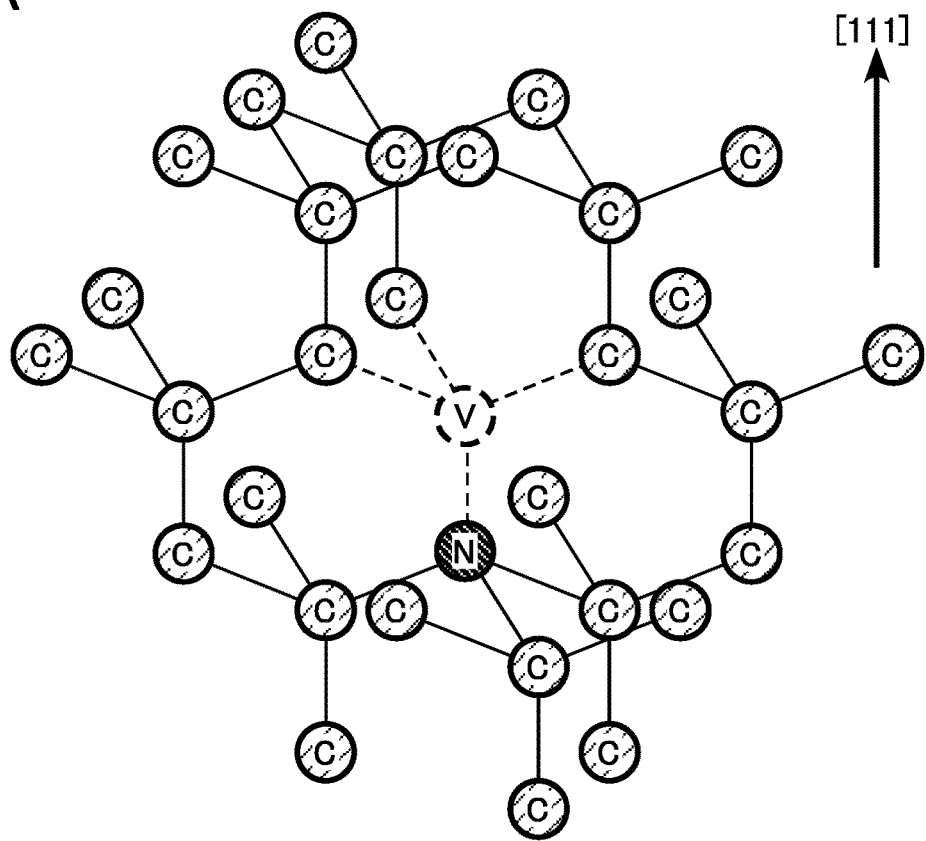
FIGS. 2A and 2B are diagrams schematically illustrating a diamond layer according to the first embodiment.
Figure 2B:
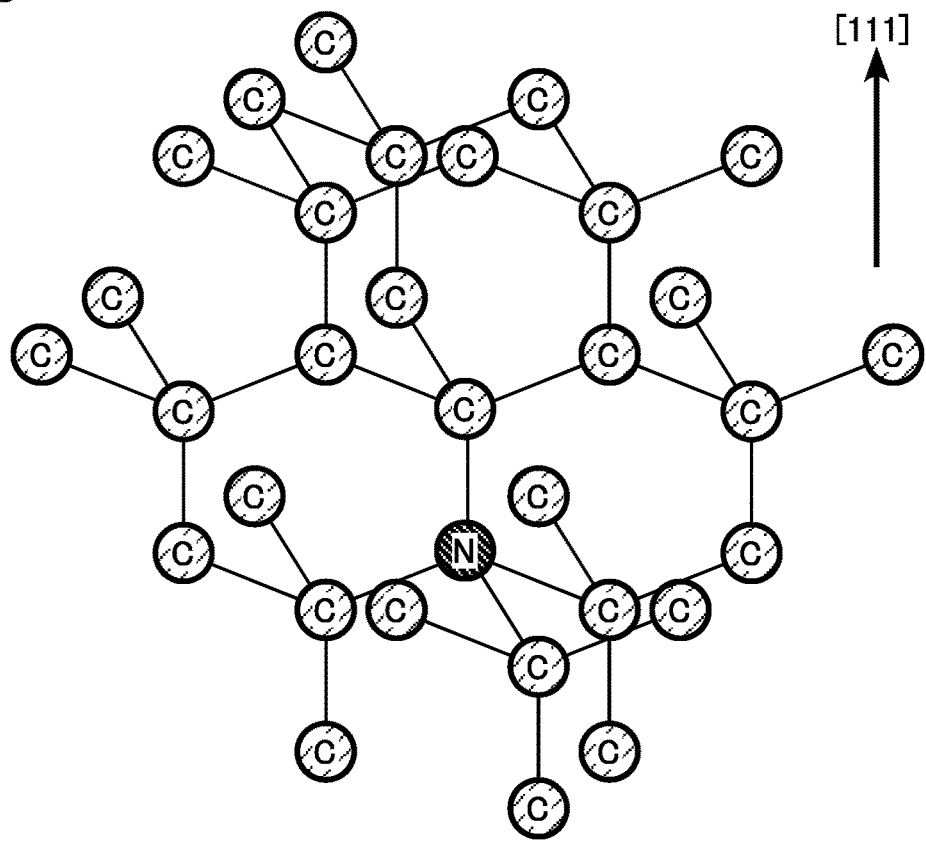

FIGS. 2A and 2B are diagrams schematically illustrating the diamond layer according to the first embodiment. FIGS. 2A and 2B illustrate a crystal structure of the diamond layer 11. FIG. 2A is a diagram illustrating a NV center. FIG. 2B is a diagram illustrating a structure in which a lattice point of carbon (C) is substituted with nitrogen (N).

As illustrated in FIG. 2A, the NV center is a complex defect in which nitrogen (N) enters a lattice point of carbon (C) in a diamond crystal and a vacancy (V) is present at a position adjacent to the nitrogen (N).

The nitrogen (N) of the NV center is threefold-coordinated. That is, the nitrogen (N) of the NV center is bonded only to three carbon atoms (C).

As illustrated in FIG. 2B, in the structure in which nitrogen (N) enters the lattice point of carbon (C), nitrogen (N) is fourfold-coordinated. That is, nitrogen (N) is bonded to four carbon atoms (C). Hereinafter, the fourfold coordinated nitrogen is referred to as substitutional nitrogen (NS).

The number of threefold coordinated nitrogen atoms in the diamond layer 11 is larger than the number of fourfold coordinated nitrogen atoms. In other words, the number of NV centers in the diamond layer 11 is larger than the number of substitutional nitrogen atoms (NS).

The percentage of threefold coordinated nitrogen atoms among the nitrogen atoms included in the diamond layer 11 is preferably, for example, equal to or greater than 95% and more preferably equal to or greater than 99%. The percentage may be 100%. In other words, the percentage of nitrogen atoms forming the NV centers among the nitrogen atoms included in the diamond layer 11 is preferably, for example, equal to or greater than 95% and more preferably equal to or greater than 99%. The percentage may be 100%.

The concentration of nitrogen in the diamond layer 11 is, for example, equal to or greater than $1\times10^{18}$ cm$^{-3}$ and equal to or less than $1\times10^{22}$ cm$^{-3}$.

Figure 3A:
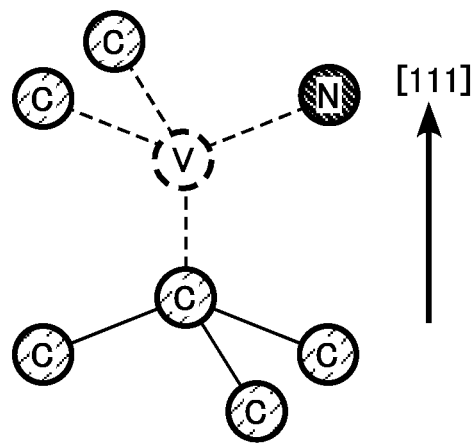
FIGS. 3A, 3B, and 3C are diagrams schematically illustrating a NV center according to the first embodiment.
Figure 3B:
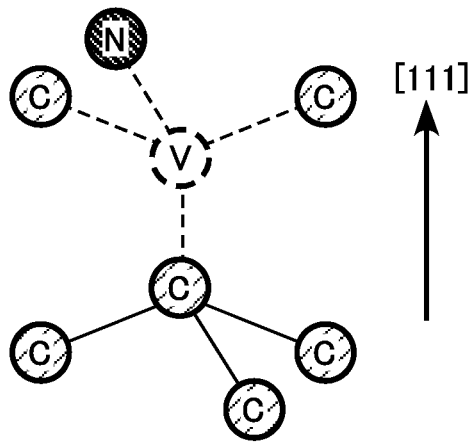
Figure 3C:
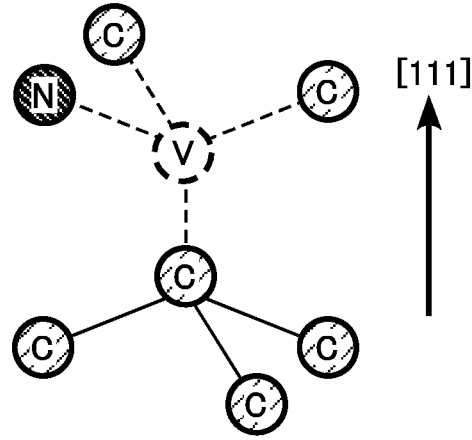

FIGS. 3A, 3B, and 3C are diagrams illustrating the NV center according to the first embodiment. FIGS. 3A, 3B, and 3C illustrate a variation in the NV center.

Nitrogen (N) and a vacancy (V) of the NV center can be connected in four directions according to the substitution position of nitrogen. That is, the four directions are a [111] direction, a [1-1-1] direction, a [-11-1] direction, and a [-1-11] direction. Hereinafter, the direction in which the nitrogen (N) and the vacancy (V) of the NV center are connected is referred to as an axial direction of the NV center.

In FIG. 2A, the axial direction of the NV center is the direction. In FIGS. 3A, 3B, and 3C, the axial direction of the NV center is the [1-1-1] direction, the [-11-1] direction, and the [-1-11] direction, respectively.

For example, the axial directions of the NV centers in the diamond layer 11 are aligned with the [111] direction at a rate of 95% or more. For example, the axial directions of the NV centers in the diamond layer 11 are aligned with the [111] direction at a rate of 99% or more.

The magnitude relationship between the amount of threefold coordinated nitrogen and the amount of fourfold coordinated nitrogen in the diamond layer 11 can be measured by, for example, X-ray photoelectron spectroscopy (XPS) or a Fourier transform infrared spectrophotometer (FT-IR).

The concentration of nitrogen in the diamond layer 11 can be measured by, for example, secondary ion mass spectrometry (SIMS).

The axial direction of the NV center in the diamond layer 11 can be detected by optically detected magnetic resonance (ODMR).

Figure 4:
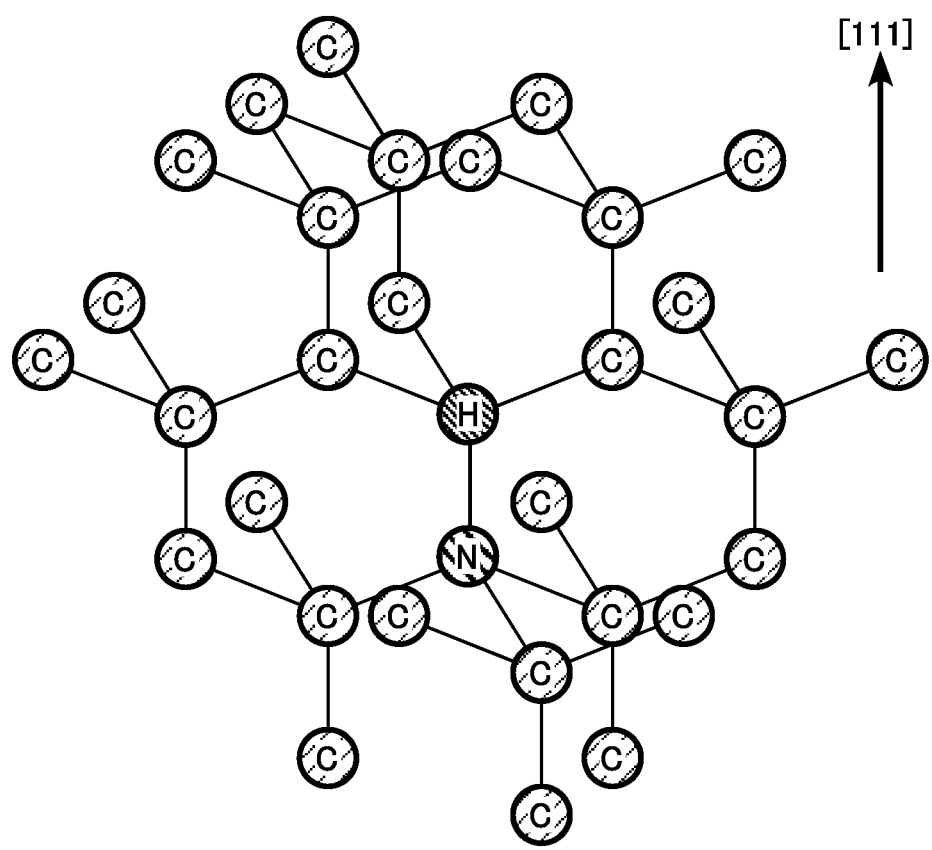
FIG. 4 is a diagram illustrating an example of a method for manufacturing the diamond substrate according to the first embodiment.
Figure 5:
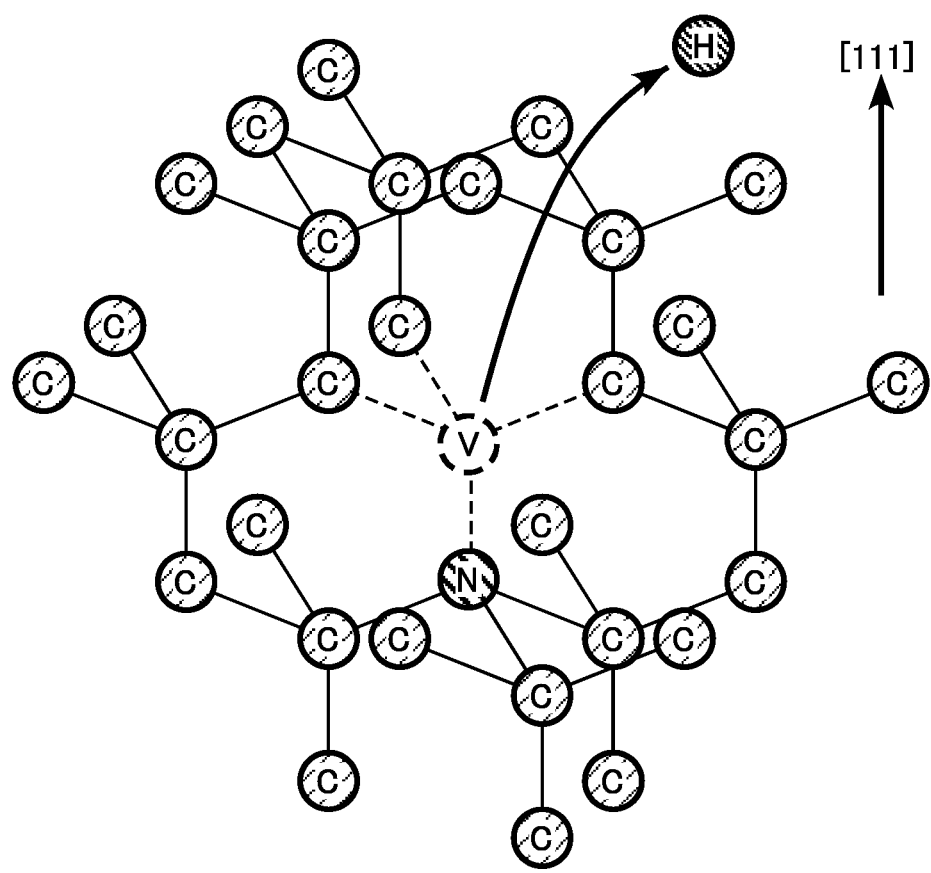
FIG. 5 is a diagram illustrating an example of the method for manufacturing the diamond substrate according to the first embodiment.

Next, an example of a method for manufacturing the diamond substrate 100 according to the first embodiment will be described. FIGS. 4 and 5 are diagrams illustrating an example of the method for manufacturing the diamond substrate according to the first embodiment.

In the method for manufacturing the diamond substrate 100 according to the first embodiment, a diamond layer having a surface that has an off angle of 10 degrees or less with respect to the (111) face is formed on a substrate in an atmosphere including hydrocarbon (CHx), at least one element selected from the group consisting of nitrogen (N), phosphorus (P), arsenic (As), antimony (Sb), and bismuth (Bi), and atomic hydrogen (H). Then, a heat treatment is performed in a non-oxidizing atmosphere at a temperature that is equal to or less than 1000° C. Next, a case in which the element is nitrogen will be described as an example.

First, the base layer 10 (substrate) made of single crystal diamond is prepared. The off angle between the surface of the base layer 10 and the (111) face is equal to or less than 10 degrees.

Then, the diamond layer 11 having a surface that has an off angle of 10 degrees or less with respect to the (111) face is formed on the base layer 10 by epitaxial growth. The diamond layer 11 is formed by, for example, a chemical vapor deposition (CVD) method.

For example, the diamond layer 11 is formed in an atmosphere including methane ($CH_4$), nitrogen gas ($N_2$), hydrogen gas ($H_2$), and atomic hydrogen (H). The atomic hydrogen is generated by a heated catalyzer method.

In the heated catalyzer method, hydrogen gas is introduced into a heated tungsten filament. The dissociative absorption of hydrogen molecules on the tungsten filament occurs. Then, the atomic hydrogen is thermally desorbed from the tungsten filament. The heating temperature of the tungsten filament is, for example, 1600° C.

The heated catalyzer method is an atomic element generation method that causes thermal dissociation using a metal filament for thermal dissociation. The heated catalyzer method can dissociate, for example, fluorine molecules, hydrogen molecules, and deuterium molecules into fluorine atoms, hydrogen atoms, and deuterium atoms, respectively. The metal filament is, for example, tungsten, molybdenum, iron chromium, rhenium, or thorium.

The diamond layer 11 is formed at a temperature that is, for example, equal to or greater than 500° C. and equal to or less than 800° C.

The diamond layer 11 is formed by depositing atoms in the [111] direction. As illustrated in FIG. 4, a bonding structure in which nitrogen (N) enters a lattice point of carbon (C) in a diamond crystal and hydrogen (H) enters a lattice point of carbon (C) adjacent to the nitrogen (N) is formed in the diamond layer 11. The nitrogen (N) and the adjacent hydrogen (H) are bonded to each other. Hereinafter, this bonding structure is referred to as a nitrogen-hydrogen center (NH center).

The direction in which nitrogen (N) and hydrogen (H) of the NH center are connected is the [111] direction. Hereinafter, the direction in which nitrogen (N) and hydrogen (H) are connected is referred to as an axial direction of the NH center.

Then, a heat treatment (first heat treatment) is performed in a non-oxidizing atmosphere at a temperature that is equal to or greater than 850° C. and equal to or less than 1000° C. The non-oxidizing atmosphere is, for example, annealing in at least one gas selected from nitrogen gas, argon gas, and helium gas.

As illustrated in FIG. 5, hydrogen (H) of the NH center is separated from nitrogen (N) and is diffused to the outside of the diamond layer 11 by the heat treatment.

As a result, the NH center is converted into the NV center. The axial direction of the generated NV center is maintained as the axial direction of the NH center and is the direction.

In a case in which a heat treatment is performed at a temperature of greater than 1000° C., the position of the vacancy (V) is moved and there is a concern that the axial direction of the NV center will be a direction other than the [111] direction. The temperature of the heat treatment is preferably equal to or less than 950° C. and more preferably equal to or less than 900° C.

In a case in which a heat treatment is performed, a magnetic field may be applied to the diamond layer 11. It is possible to align the axial direction of the NV center with the direction at a rate of nearly 100% by performing a heat treatment while applying the magnetic field to the diamond layer 11 in the [111] direction.

In addition, in a case in which the heat treatment is performed while the magnetic field is applied, the axial direction of the NV center can be aligned even by a heat treatment at a temperature of greater than 1000° C. For example, it is possible to perform the heat treatment at a temperature that is greater than 1000° C. and equal to or less than 1300° C. For example, it is possible to perform a heat treatment at a temperature that is equal to or greater than 1150° C. and equal to or less than 1300° C. Therefore, it is possible to convert the NH center into the NV center in a short time.

The diamond substrate 100 illustrated in FIG. 1 is manufactured by the above-mentioned manufacturing method.

Next, the function and effect of the diamond substrate 100 according to the first embodiment and the method for manufacturing the diamond substrate 100 will be described.

It has been examined that the NV center is applied to a quantum device, such as a quantum computer, a quantum information device, or a quantum sensor, or a quantum system, using the spin of the NV center or the optical characteristics of the NV center. It is desirable to increase the density of the NV centers in diamond in order to apply the NV center to the quantum device or the quantum system. In addition, it is desirable that the axial direction of the NV center is aligned with one direction. In a case in which the axial direction of the NV center is aligned with one direction, the direction of the spin of the NV center is aligned.

For example, in a case in which a magnetic sensor is manufactured using the NV center, the density of the NV centers whose axial direction are aligned in the diamond substrate is high and the sensitivity of the magnetic sensor is improved. In addition, for example, in a case in which a quantum memory is manufactured using the NV center, the density of the NV centers whose axial directions are aligned in the diamond substrate is high and the memory density of the quantum memory is improved.

In the diamond substrate 100 according to the first embodiment, the NV centers whose axial directions are aligned are present at high density. Therefore, it is possible to achieve a quantum device or a quantum system with a high performance. The high-density NV centers can be achieved by generating NH centers and then converting the NH centers into NV centers in a case in which the diamond layer 11 is formed. This will be described in detail below.

According to the first principle calculation, in a case in which nitrogen introduced into diamond is present at the lattice point of diamond, nitrogen is more stable than that in a case in which nitrogen is present between the lattices of diamond. In a case in which nitrogen introduced into diamond is present at the lattice point of diamond, generation energy is 4.7 eV lower than that in a case in which nitrogen is present between the lattices of diamond. Therefore, nitrogen is energetically stable at the lattice point of diamond. As a result, in a case in which nitrogen is introduced into diamond, the structure illustrated in FIG. 2B in which nitrogen (N) enters the lattice point of carbon (C), that is, fourfold coordinated substitutional nitrogen (NS) is likely to be formed.

The first principle calculation proved that, in a case in which substitutional nitrogen (NS) and a vacancy (V) coexisted, the substitutional nitrogen (NS) and the vacancy (V) formed the NV center and were stabilized. That is, in a case in which the substitutional nitrogen (NS) and the vacancy (V) are adjacent to each other and generate the NV center, generation energy is 5.0 eV lower than that in a case in which the substitutional nitrogen (NS) and the vacancy (V) are separately present. Therefore, the substitutional nitrogen (NS) and the vacancy (V) are energetically stable. As a result, in a case in which a state in which the substituted nitrogen (NS) and the vacancies (V) coexist is created, the NV center is likely to be generated.

According to the first principle calculation, in a case in which the stability of the substitutional nitrogen (NS) is compared with the stability of a pair of the NV center and interstitial carbon, the generation energy of the substitutional nitrogen (NS) is 2.0 eV lower than that of the pair and the substitutional nitrogen (NS) is more stable than the pair. Therefore, it is difficult to move carbon (C) bonded to the substitutional nitrogen (NS) between the lattices to generate the NV center.

The result of the first principle calculation proves that the substitutional nitrogen (NS) which is energetically stable is formed only by simply introducing nitrogen into diamond and the probability of the NV center being generated is very low. Therefore, it is difficult to manufacture the diamond substrate in which the density of the NV centers is high. In other words, most of the introduced nitrogen becomes substitutional nitrogen (NS). In the related art, only about 2.5% of the introduced nitrogen becomes the NV center and 97.5% of the introduced nitrogen is in the state of substituted nitrogen (NS). However, the number of NV centers can be increased and the number of substitutional nitrogen atoms (NS) can be reduced by the manufacturing method according to the first embodiment.

In the method for manufacturing the diamond substrate 100 according to the first embodiment, as illustrated in FIG. 4, in a case in which the diamond layer 11 is formed, the NH center is generated once. The result of the first principle calculation proves that, in a case in which substitutional nitrogen (NS) and atomic hydrogen (H) coexist, the generation of the NH center is stabilized.

In the method for manufacturing the diamond substrate 100 according to the first embodiment, the diamond layer 11 is formed in an atmosphere including atomic hydrogen (H) in addition to nitrogen. Nitrogen (N) and hydrogen (H) in an atomic state which results from atomic hydrogen (H) are bonded to generate the NH center.

In particular, the use of the atomic hydrogen (H) generated by a heated catalyzer method makes it possible to reduce the damage of the diamond layer 11 and to generate the NH center with high efficiency.

In a case in which nitrogen (N) and hydrogen (H) are separated by a heat treatment after the NH center is generated, nitrogen (N) and a vacancy (V) at the lattice points are formed. In a case in which the NV center is generated, the nitrogen (N) and the vacancy (V) are more energetically stable than those in a case in which the substitutional nitrogen (NS) and the vacancy (V) are separately present. Therefore, the NV center is generated. That is, the NH center is converted into the NV center while being aligned in the [111] direction which is the axial direction.

In a case in which the diamond layer 11 is formed on the (111) face by a CVD method, the diamond layer 11 is formed by depositing atoms in the [111] direction. At that time, in a case in which nitrogen and atomic hydrogen are introduced, first, threefold coordinated nitrogen is formed and hydrogen is bonded to a position immediately above the threefold coordinated nitrogen. As a result, the bonding is most energetically stable. Therefore, the axial directions of the NH centers are aligned with the [111] direction at a rate of at least 95% or more.

In order to improve the characteristics of a quantum device or a quantum system using the diamond substrate 100, the percentage of threefold coordinated nitrogen atoms among the nitrogen atoms included in the diamond layer 11 is preferably equal to or greater than 95% and more preferably equal to or greater than 99%. In other words, the percentage of nitrogen atoms forming the NV centers in among the nitrogen atoms included in the diamond layer 11 is preferably equal to or greater than 95% and more preferably equal to or greater than 99%. The percentage can be achieved by a manufacturing method for converting the NH center into the NV center. The rate of alignment in the [111] direction can be increased by performing deposition for enough time while taking a stable structure.

In order to improve the characteristics of a quantum device or a quantum system using the diamond substrate 100, the axial directions of the NV centers in the diamond layer 11 are preferably aligned with the [111] direction at a rate of, for example, 95% or more and is more preferably aligned with the direction at a rate of 99% or more. The percentage can be achieved by a manufacturing method for converting the NH center into the NV center using a CVD method.

For example, the concentration of nitrogen included in the diamond layer 11 is preferably equal to or greater than $1\times10^{18}$ cm$^{-3}$ and equal to or less than $1\times10^{22}$ cm$^{-3}$. In a case in which the concentration is below the range, there is a concern that the density of the NV centers will be insufficient. In a case in which the concentration is above the range, there is a concern that the crystallinity of diamond will be reduced.

In the related art, the concentration of the introduced nitrogen is about $3.2\times10^{19}$ cm$^{-3}$ at most. 2.5% of the introduced nitrogen which corresponds to a concentration of about $8.0\times10^{17}$ cm$^{-3}$ becomes the NV center. Even in a case in which nitrogen equal to or greater than the concentration is introduced, the amount of NV center does not increase and only the amount of substitutional nitrogen causing disturbance increases. For this reason, the introduction of nitrogen equal to or greater than the concentration is meaningless.

In contrast, in the NH structure in which hydrogen is introduced, it is possible to start from the NH structure in which distortion has been reduced. That is, since substitutional nitrogen causing disturbance is not formed, it is possible to introduce a large amount of nitrogen. The amount of nitrogen which has been difficult to introduce in the related art can be introduced. For example, the amount of nitrogen can be equal to or greater than $5\times10^{19}$ cm$^{-3}$ and equal to or less than $1\times10^{22}$ cm$^{-3}$. A large amount of nitrogen is effective in improving characteristics. The amount of nitrogen is preferably equal to or greater than $1\times10^{20}$ cm$^{-3}$ and equal to or less than $5\times10^{21}$ cm$^{-3}$ and is more preferably equal to or greater than $5\times10^{20}$ cm$^{-3}$ and equal to or less than $1\times10^{21}$ cm$^{-3}$. Typically, the amount of nitrogen is about $5\times10^{20}$ cm$^{-3}$. In a case in which nitrogen is uniformly distributed in a thickness range of 5 nm from the surface, the NV centers are distributed at an area density of about $1\times10^{13}$ cm$^{-2}$ in the diamond substrate.

In order to generate the NV center whose axial direction is stably aligned in the vicinity of the surface of the diamond layer 11, the off angle between the surface S of the diamond layer 11 and the (111) face is preferably equal to or less than 10 degrees and more preferably equal to or greater than 0.5 degrees and equal to or less than 2 degrees.

As described above, according to the first embodiment, a high-quality diamond substrate in which the density of the NV centers is high is achieved. In addition, a high-quality diamond substrate in which the axial direction of the NV centers are aligned at a high rate is achieved.

Second Embodiment

A diamond substrate according to a second embodiment differs from the diamond substrate according to the first embodiment in that it has a phosphorus-vacancy center (PV center), an arsenic-vacancy center (AsV center), an antimony-vacancy center (SbV center), or a bismuth-vacancy center (BiV center) instead of the nitrogen-vacancy center (NV center). Hereinafter, the description of a portion of the same content as that in the first embodiment will not be repeated.

Figure 6A:
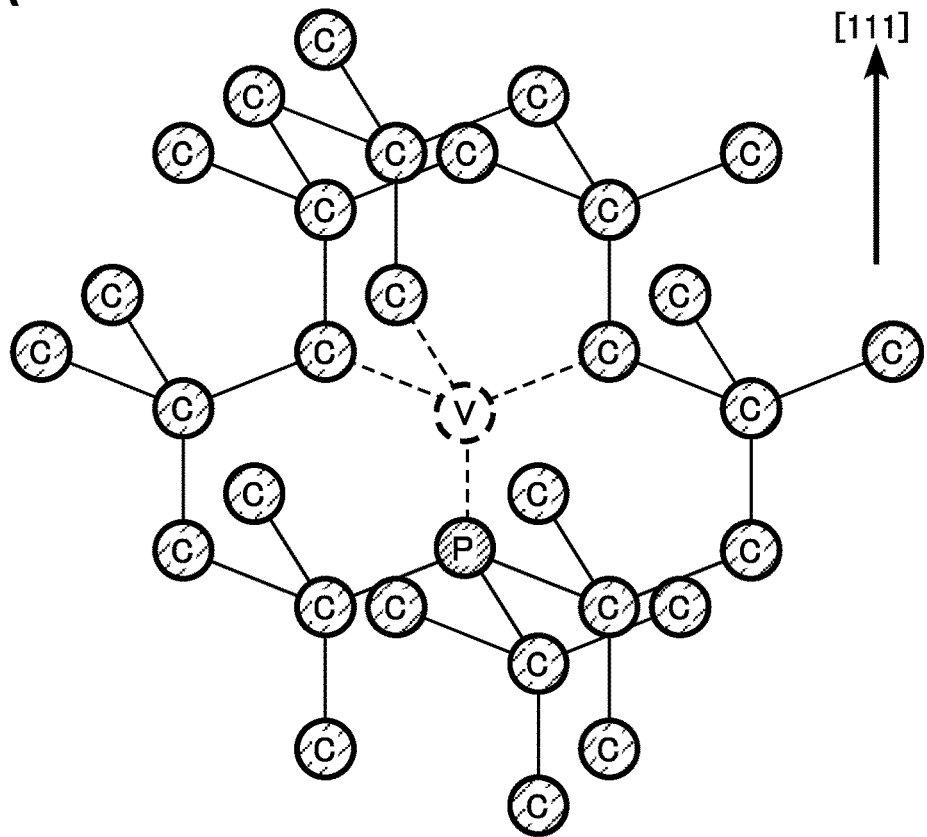
FIGS. 6A and 6B are diagrams schematically illustrating a diamond layer according to a second embodiment.
Figure 6B:
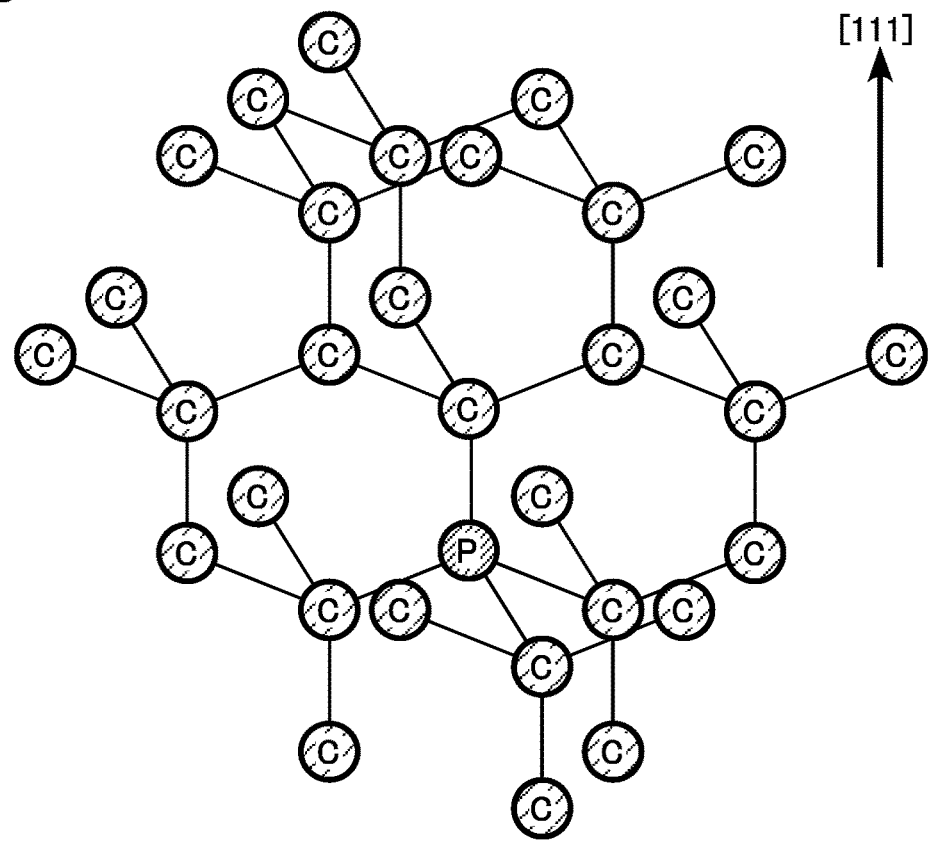

FIGS. 6A and 6B are diagrams schematically illustrating a diamond layer according to the second embodiment. FIGS. 6A and 6B illustrate a crystal structure of a diamond layer 11. FIG. 6A is a diagram illustrating the PV center. FIG. 6B is a diagram illustrating a structure in which phosphorus (P) enters a lattice point of carbon (C).

As illustrated in FIG. 6A, the PV center is a complex defect in which phosphorus (P) enters the lattice point of carbon (C) in a diamond crystal and a vacancy (V) is present at a position adjacent to the phosphorus (P).

The phosphorus (P) of the PV center is threefold-coordinated. That is, the phosphorus (P) of the PV center is bonded only to three carbon atoms (C).

As illustrated in FIG. 6B, in the structure in which phosphorus (P) enters the lattice point of carbon (C), the phosphorus (P) is fourfold-coordinated. That is, the phosphorus (P) is bonded to four carbon atoms (C). Hereinafter, the fourfold coordinated phosphorus (P) is referred to as substitutional phosphorus (PS).

The number of threefold coordinated phosphorus atoms in the diamond layer 11 is larger than the number of fourfold coordinated phosphorus atoms. In other words, the number of PV centers in the diamond layer 11 is larger than the number of substitutional phosphorus atoms (PS).

The percentage of threefold coordinated phosphorus atoms among the phosphorus atoms included in the diamond layer 11 is preferably, for example, equal to or greater than 95% and more preferably equal to or greater than 99%. In other words, the percentage of phosphorus atoms forming the PV centers among the phosphorus atoms included in the diamond layer 11 is preferably, for example, equal to or greater than 95% and more preferably equal to or greater than 99%.

The concentration of phosphorus in the diamond layer 11 is, for example, equal to or greater than $1\times10^{18}$ cm$^{-3}$ and equal to or less than $1\times10^{22}$ cm$^{-3}$.

For example, the axial direction of the PV centers in the diamond layer 11 are aligned with the [111] direction at a rate of 95% or more. For example, the axial directions of the PV centers in the diamond layer 11 are aligned with the [111] direction at a rate of 99% or more.

The diamond substrate according to the second embodiment can be manufactured by the same method as the diamond substrate 100 according to the first embodiment only by substituting nitrogen with phosphorus.

It is considered that it is easier to increase the density of the PV centers in diamond than to increase the density of the NV centers in diamond.

As described above, in a case in which the stability of the substitutional nitrogen (NS) is compared with the stability of a pair of the NV center and interstitial carbon, the generation energy of the substitutional nitrogen (NS) is 2.0 eV lower than that of the pair and the substitutional nitrogen (NS) is more stable than the pair. Therefore, it is difficult to move carbon (C) adjacent to the substitutional nitrogen (NS) between the lattices to generate the NV center.

In contrast, in a case in which the stability of the substitutional phosphorus (PS) is compared with the stability of a pair of the PV center and interstitial carbon, the generation energy of the pair of the PV center and interstitial carbon is 0.8 eV lower than that of the substitutional phosphorus (PS) and the pair is more stable than the substitutional phosphorus (PS). Therefore, it is easy to move carbon (C) adjacent to the substitutional phosphorus (PS) between the lattices to generate the PV center.

It is considered that the reason is as follows. The radius of a phosphorus atom is larger than the radius of a carbon atom. In a case in which phosphorus enters a lattice point, the distortion of a diamond crystal increases. It is advantageous to generate the vacancy (V) in order to reduce distortion, in terms of energy.

The PV center has the same spin or optical characteristics as the NV center. Therefore, the use of the diamond substrate according to the second embodiment makes it possible to achieve a quantum device or a quantum system with a high performance.

Further, it is possible to form the AsV center, the SbV center, or the BiV center, using arsenic (As), antimony (Sb), or bismuth (Bi) having a larger atom radius than phosphorus (P), instead of phosphorus (P). In the case of the AsV center, the SbV center, or the BiV center, it is considered that the AsV center, the SbV center, and the BiV center are easy to generate, for the same reason as phosphorus.

In addition, it is considered that the AsV center, the SbV center, and the BiV center have the same spin or optical characteristics as the NV center.

As described above, according to the second embodiment, a high-quality diamond substrate in which the density of the PV centers, the AsV centers, the SbV centers, or the BiV centers is high is achieved. In addition, a high-quality diamond substrate in which the axial directions of the PV centers, the AsV centers, the SbV centers, or the BiV centers are aligned at a high rate is achieved.

Third Embodiment

A diamond substrate according to a third embodiment includes a diamond layer including at least one first element selected from the group consisting of nitrogen (N), phosphorus (P), arsenic (As), antimony (Sb), and bismuth (Bi), the diamond layer having a first bonding structure and a second bonding structure, the first bonding structure having the first element and hydrogen bonded to the first element, the second bonding structure having the first element and four carbon atoms bonded to the first element, the number of first bonding structures being larger than the number of second bonding structures, a surface of the diamond layer having an off angle of 10 degrees or less with respect to a (111) face.

The diamond substrate according to the third embodiment differs from the diamond substrate according to the first embodiment in that it has a nitrogen-hydrogen center (NH center) instead of the nitrogen-vacancy center (NV center).

Hereinafter, the description of a portion of the same content as that in the first embodiment will not be repeated.

Figure 7A:
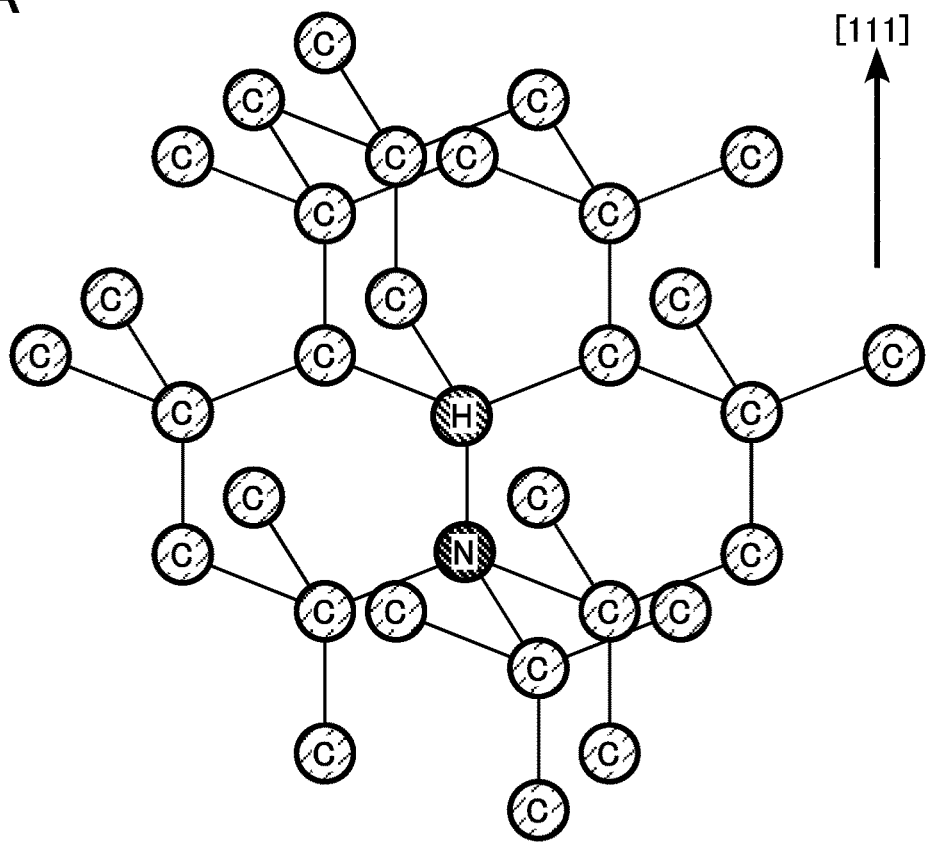
FIGS. 7A and 7B are diagrams schematically illustrating a diamond layer according to a third embodiment.
Figure 7B:
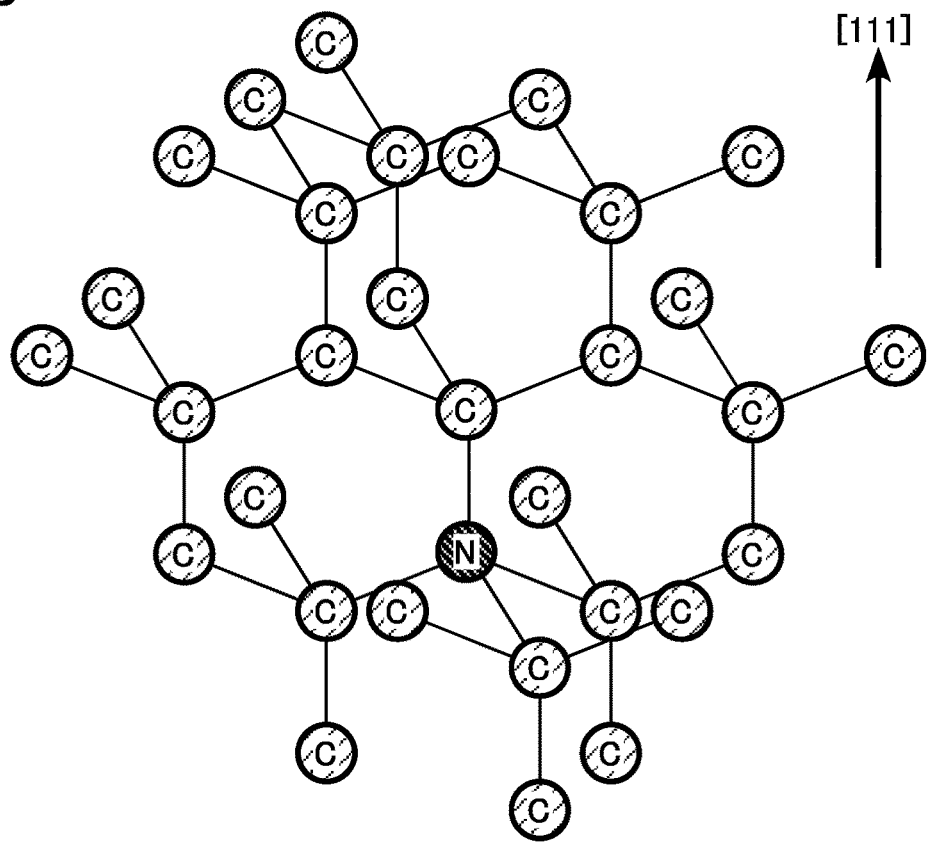

FIGS. 7A and 7B are diagrams schematically illustrating the diamond layer according to the third embodiment. FIGS. 7A and 7B illustrate a crystal structure of a diamond layer 11. FIG. 7A is a diagram illustrating a first bonding structure. FIG. 7B is a diagram illustrating a second bonding structure.

As illustrated in FIG. 7A, in the first bonding structure, nitrogen (N) enters a lattice point of carbon (C) in a diamond crystal and hydrogen (H) enters the lattice point of carbon (C) adjacent to the nitrogen (N). The first bonding structure is the same as the NH center described in the first embodiment.

The nitrogen (N) of the NH center is bonded to one hydrogen atom (H) and three carbon atoms (C).

As illustrated in FIG. 7B, in the second bonding structure, nitrogen (N) enters a lattice point of carbon (C). In this case, nitrogen (N) is fourfold-coordinated. That is, nitrogen (N) is bonded to four carbon atoms (C). The second bonding structure is referred to as substitutional nitrogen (NS).

The number of first bonding structures in the diamond layer 11 is larger than the number of second bonding structures. In other words, the number of NH centers in the diamond layer 11 is larger than the number of substitutional nitrogen atoms (NS).

The percentage of the nitrogen atoms of the NH centers among the nitrogen atoms included in the diamond layer 11 is, for example, equal to or greater than 95%. In other words, the percentage of nitrogen atoms forming the NH centers among the nitrogen atoms included in the diamond layer 11 is, for example, equal to or greater than 95%. The percentage of nitrogen atoms forming the NH centers among the nitrogen atoms included in the diamond layer 11 is, for example, equal to or greater than 99%.

The concentration of nitrogen in the diamond layer 11 is, for example, equal to or greater than $1 \times 10^{18}$ cm$^{-3}$ and equal to or less than $1 \times 10^{22}$ cm$^{-3}$.

For example, the axial directions of the NH centers in the diamond layer 11 are aligned with the [111] direction at a rate of 95% or more. For example, the axial directions of the NH centers in the diamond layer 11 are aligned with the [111] direction at a rate of 99% or more.

The diamond substrate according to the third embodiment can be manufactured by the same method as the diamond substrate 100 according to the first embodiment only by not performing a heat treatment after the NH center is formed.

The magnitude relationship between the amount of first bonding structure and the amount of second bonding structure in the diamond layer 11 can be determined by, for example, X-ray photoelectron spectroscopy (XPS) or a Fourier transform infrared spectrophotometer (FT-IR).

The axial direction of the NH center in the diamond layer 11 can be detected by optically detected magnetic resonance (ODMR).

The NH center has the same spin or optical characteristics as the NV center. Therefore, the use of the diamond substrate according to the third embodiment makes it possible to achieve a quantum device or a quantum system with a high performance.

Further, it is possible to form a phosphorus-hydrogen center (PH center), an arsenic-hydrogen center (AsH center), an antimony-hydrogen center (SbH center), or a bismuth-hydrogen center (BiH center), using phosphorus (P), arsenic (As), antimony (Sb), or bismuth (Bi), instead of nitrogen (N).

It is considered that the PH center, the AsH center, the SbH center, and the BiH center have the same spin or optical characteristics as the NV center.

As described above, according to the third embodiment, a high-quality diamond substrate in which the density of the NH centers, the PH centers, the AsH centers, the SbH centers, or the BiH centers is high is achieved. In addition, a high-quality diamond substrate in which the axial directions of the NH centers, the PH centers, the AsH centers, the SbH centers, or the BiH centers are aligned at a high rate is achieved.

Fourth Embodiment

A diamond substrate according to a fourth embodiment differs from the diamond substrate according to the first embodiment in that it further includes an oxide layer provided on the surface of the diamond layer and a region located between the diamond layer and the oxide layer, the region including at least one second element selected from the group consisting of nitrogen (N), phosphorus (P), arsenic (As), antimony (Sb), and bismuth (Bi). Hereinafter, the description of a portion of the same content as that in the first embodiment will not be repeated.

Figure 8:
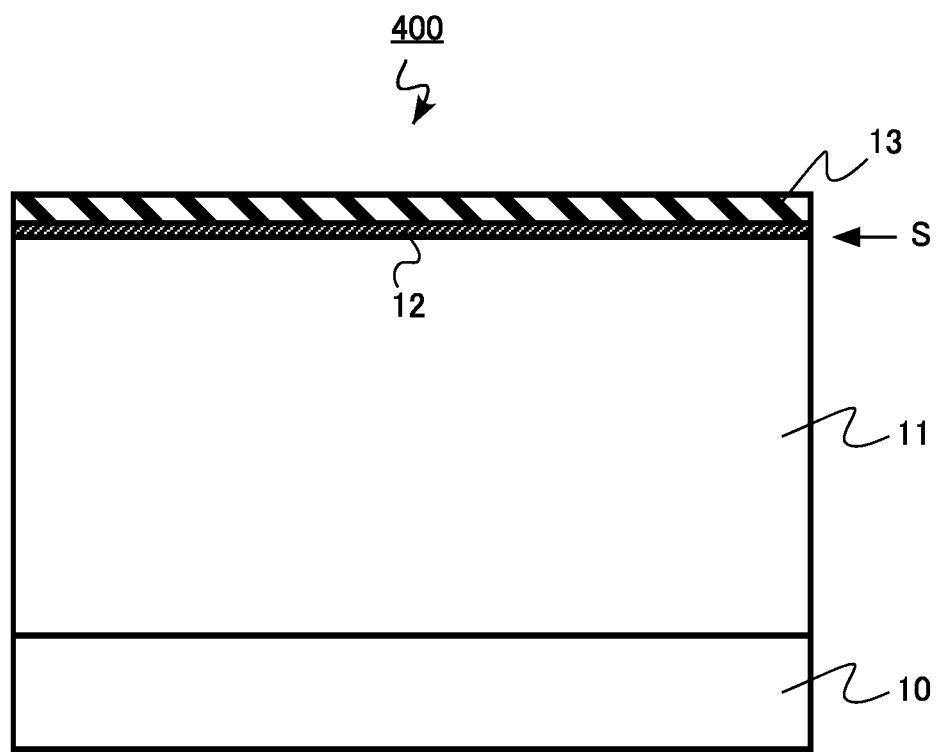
FIG. 8 is a cross-sectional view schematically illustrating a diamond substrate according to a fourth embodiment.

FIG. 8 is a cross-sectional view schematically illustrating the diamond substrate according to the fourth embodiment. A diamond substrate 400 according to the fourth embodiment includes a base layer 10 (substrate), a diamond layer 11, an interface termination region 12 (region), and a protective layer 13 (oxide layer).

The first element is used to form, for example, a NV center adjacent to a vacancy (V) in the diamond layer 11. The second element is a termination element that is present in the interface termination region 12 between the diamond layer 11 and the protective layer 13.

Next, a case in which the first element is nitrogen (N) and the second element is phosphorus (P) will be described as an example. The first element and the second element may be the same or may be different from each other.

The base layer 10 is made of single crystal diamond.

The diamond layer 11 is made of single crystal diamond. An off angle between a surface S of the diamond layer 11 and the (111) face is equal to or less than 10 degrees. The (111) face has the [111] direction as a normal line.

The protective layer 13 is provided on the diamond layer 11. The protective layer 13 is an example of an oxide layer. The protective layer 13 includes, for example, silicon oxide.

The interface termination region 12 is located between the diamond layer 11 and the protective layer 13. The interface termination region 12 includes the termination element (second element) as an element that terminates a dangling bond.

Figure 9:
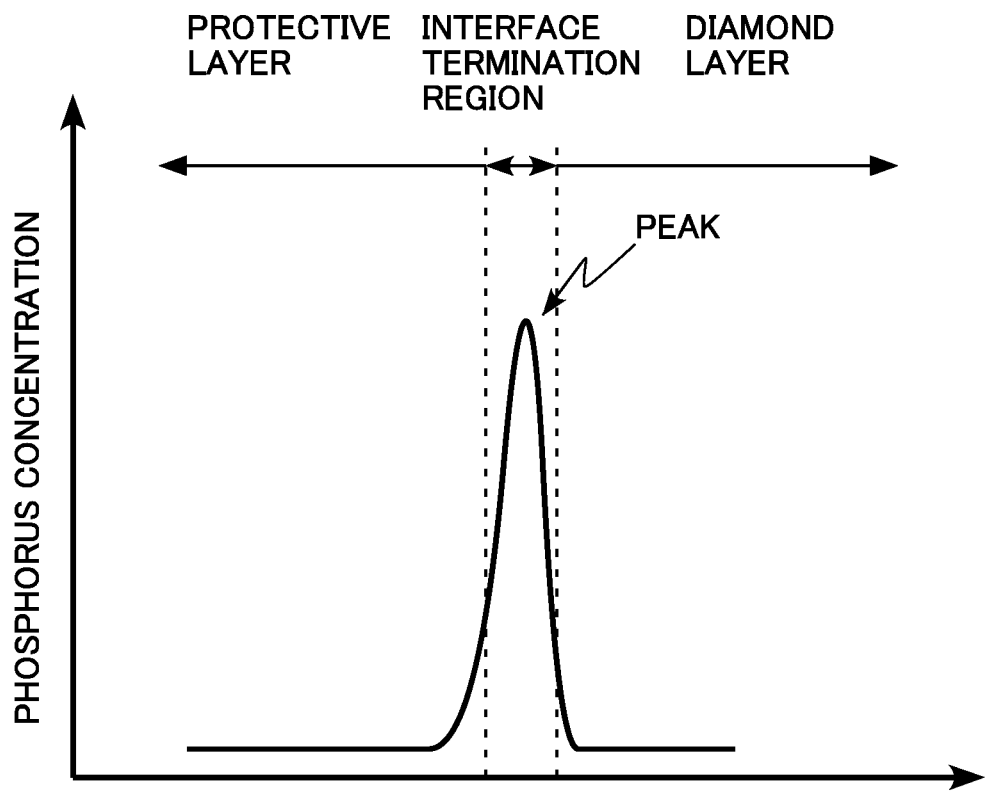
FIG. 9 is a diagram illustrating a nitrogen concentration distribution of the diamond substrate according to the fourth embodiment.

FIG. 9 is a diagram illustrating a phosphorus concentration distribution of the diamond substrate according to the fourth embodiment.

Phosphorus is segregated in an interface between the diamond layer 11 and the protective layer 13. The phosphorus concentration distribution of the diamond layer 11, the interface termination region 12, and the protective layer 13 has a peak in the interface termination region 12.

The full width at half maximum of a peak in the phosphorus concentration distribution is, for example, equal to or less than 5 nm. In addition, for example, the full width at half maximum of the peak in the phosphorus concentration distribution is preferably equal to or less than 1 nm, more preferably equal to or less than 0.25 nm, and most preferably less than 0.2 nm.

Phosphorus substitutes carbon in the surface S of the diamond layer 11. Phosphorus is threefold-coordinated with the diamond layer 11. In other words, phosphorus is located at the crystal lattice of carbon in the diamond layer 11.

The phosphorus concentration of the peak in the phosphorus concentration distribution of the interface termination region 12 is, for example, equal to or greater than $1 \times 10^{17}$ cm$^{-3}$ and equal to or less than $1 \times 10^{22}$ cm$^{-3}$. The phosphorus concentration of the peak is preferably equal to or greater than $1 \times 10^{18}$ cm$^{-3}$ and equal to or less than $1 \times 10^{21}$ cm$^{-3}$.

The concentration and distribution of phosphorus can be measured by, for example, secondary ion mass spectroscopy (SIMS).

Figure 10A:
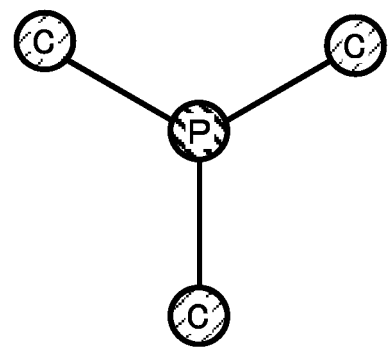
FIGS. 10A and 10B are diagrams illustrating an interface termination region according to the fourth embodiment.
Figure 10B:

FIGS. 10A and 10B are diagrams illustrating the interface termination region according to the fourth embodiment. FIG. 10A is a diagram illustrating a third bonding structure and FIG. 10B is a diagram illustrating a fourth bonding structure.

The interface termination region 12 has the third bonding structure in which phosphorus (P) is bonded to three carbon atoms (C). In the third bonding structure, phosphorus (P) is threefold-coordinated. Phosphorus (P) which is the termination element is bonded to three carbon atoms (C) that are located close to the diamond layer 11 to remove a dangling bond in the surface S.

The interface termination region 12 has the fourth bonding structure including oxygen (O) bonded to carbon (C) and silicon (Si) bonded to the oxygen (O). In the fourth bonding structure, the carbon (C) and the silicon (Si) are bonded with the oxygen (O) interposed therebetween. The carbon (C) is located close to the diamond layer 11. The silicon (Si) and the oxygen (O) are located close to the protective layer 13.

The number of third bonding structures in the interface termination region 12 is less than, for example, the number of fourth bonding structures in the interface termination region 12. The number of third bonding structures in the interface termination region 12 is, for example, equal to or less than one tenth of the number of fourth bonding structures in the interface termination region 12.

Whether the third bonding structure and the fourth bonding structure are present in the interface termination region 12 and the magnitude relationship between the amount of third bonding structure and the amount of fourth bonding structure can be measured by, for example, X-ray photoelectron spectroscopy (XPS) or a Fourier transform infrared spectrophotometer (FT-IR).

In a case in which the protective layer 13 is not provided on the surface S of the diamond layer 11, a dangling bond of carbon (C) is present in the outermost surface of the diamond layer 11. In this case, the dangling bond acts as an electron trap and there is a concern that the valence of the NV center in the diamond layer 11 will not be stabilized. As a result, there is a concern that the spin of the NV center in the vicinity of the surface will not function.

In the diamond substrate 400 according to the fourth embodiment, oxygen forming the protective layer 13 and carbon in the outermost surface of the diamond layer 11 are bonded to each other to reduce the dangling bonds in the surface S. In addition, the termination element is threefold-coordinated and is bonded to carbon (C) to further reduce the dangling bonds in the surface S.

Therefore, the spin of the NV center in the vicinity of the surface functions effectively.

The case in which the termination element (second element) is phosphorus (P) has been described as an example. However, at least one element selected from the group consisting nitrogen (N), arsenic (As), antimony (Sb), and bismuth (Bi) may be applied as the termination element. In this case, it is possible to obtain the same function and effect as those in a case in which the termination element is phosphorus (P). In particular, it is preferable that the termination element is phosphorus (P) or nitrogen (N) in terms of the stability of the interface termination region 12.

Next, a method for manufacturing the diamond substrate according to the fourth embodiment will be described.

First, a diamond substrate that includes a diamond layer having a NV center is manufactured by the manufacturing method according to the first embodiment.

Then, a silicon oxide layer is formed on the diamond layer. The thickness of the silicon oxide layer is, for example, equal to or greater than 1 nm and equal to or less than 20 nm. The silicon oxide layer is formed at a low temperature of, for example, 300° C. or less.

Then, a heat treatment (second heat treatment) is performed in an atmosphere including at least one element selected from the group consisting of nitrogen (N), phosphorus (P), arsenic (As), antimony (Sb), and bismuth (Bi).

For example, the heat treatment (second heat treatment) is performed under the following conditions: at least one type of oxygen containing gas selected from NO, PO, AsO, SbO, BiO, $NOCl_3$, $POCl_3$, $AsOCl_3$, $SbOCl_3$, and $BiOCl_3$ is diluted with at least one type of dilution gas selected from $N_2$, Ar, and He; a heat treatment temperature is equal to or greater than 1150° C. and equal to or less than 1300° C.; and the concentration of the oxygen containing gas is equal to or greater than 50 ppm and equal to or less than 500 ppm.

For example, the heat treatment (second heat treatment) is performed under the conditions of a heat treatment temperature that is equal to or greater than 1150° C. and equal to or less than 1300° C. and an oxygen gas concentration that is equal or to greater than 50 ppm and equal to or less than 500 ppm or a heat treatment temperature that is equal to or greater than 1200° C. and equal to or less than 1300° C. and an oxygen gas concentration that is equal or to greater than 50 ppm and equal to or less than 350 ppm.

In the heat treatment (second heat treatment), it is preferable to apply a magnetic field to the diamond layer.

The diamond substrate according to the fourth embodiment can be manufactured by the above-mentioned manufacturing method.

As described above, according to the fourth embodiment, a high-quality diamond substrate in which the density of the NV centers is high is achieved. In addition, a high-quality diamond substrate in which the axial directions of the NV centers are aligned at a high rate is achieved. Further, a high-quality diamond substrate in which the spin of the NV center in the vicinity of the surface of the diamond layer 11 functions effectively is achieved.

Fifth Embodiment

A quantum device and a quantum system according to a fifth embodiment include the diamond substrate according to the first to fourth embodiments.

Figure 11:
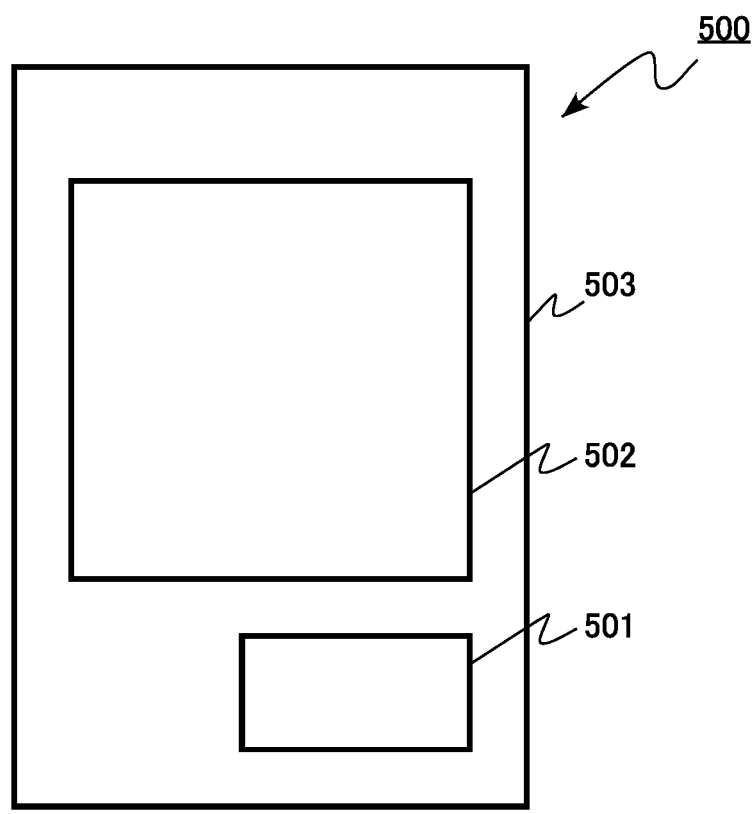
FIG. 11 is a diagram schematically illustrating a quantum system according to a fifth embodiment.

FIG. 11 is a diagram schematically illustrating the quantum system according to the fifth embodiment. The quantum system according to the fifth embodiment is, for example, a quantum computer 500.

The quantum computer 500 includes a quantum arithmetic chip 501 and a quantum memory 502 accommodated in a housing 503. The quantum arithmetic chip 501 and the quantum memory 502 are an example of the quantum device. The quantum arithmetic chip 501 and the quantum memory 502 are manufactured using, for example, the diamond substrate according to the first to fourth embodiments.

According to the fifth embodiment, since the high-quality diamond substrate according to the first to fourth embodiments is used, it is possible to achieve a quantum device or a quantum system with a high performance.

Sixth Embodiment

A quantum magnetic sensor according to a sixth embodiment includes the diamond substrate according to the first to fourth embodiments.

The NV center has the property (Zeeman effect) that a resonance frequency in a quantum state varies depending on the intensity of the magnetic field and magnetism can be detected by using this property. As the number of NV centers contributing to detecting magnetism increases, magnetic sensitivity is improved. Therefore, for example, femtotesla-level sensitivity required for medical application at room temperature can be expected by the use of the diamond substrate including high-density NV centers. In particular, for example, the NV centers have a high density of at least $10^{17}$ $cm^{-3}$ or more. It is preferable to use a diamond layer in which the NV center is aligned in one direction.

In the related art, a magnetic sensor needs to be cooled at a low temperature and a large cooling device is required. However, according to the sixth embodiment, since magnetism can be measured in the range of room temperature to a high temperature of several hundred degrees centigrade, cooling is not required. Therefore, for example, magnetic measurement having a higher accuracy than that in the related art can be performed with a simple and inexpensive device configuration which can be attached to the body, worn like clothes, or worn like a hat.

In the fifth embodiment, the quantum arithmetic chip 501 and the quantum memory 502 have been described as an example of the quantum device and the quantum computer 500 has been described as an example of the quantum system. In the sixth embodiment, the magnetic sensor has been described as an example of the quantum device. However, embodiments may be applied to other quantum devices or quantum systems.

While certain embodiments have been described, these embodiments have been presented by way of example only, and are not intended to limit the scope of the inventions. Indeed, the diamond substrate, the quantum device, the quantum system, and the diamond substrate manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A diamond substrate comprising:
a diamond layer including at least one first element selected from the group consisting of nitrogen (N), phosphorus (P), arsenic (As), antimony (Sb), and bismuth (Bi), the number of threefold coordinated atoms of the at least one first element in the diamond layer being larger than the number of fourfold coordinated atoms of the at least one first element in the diamond layer, a surface of the diamond layer having an off angle of 10 degrees or less with respect to a (111) face.

2. The diamond substrate according to claim 1, wherein directions connecting the threefold coordinated atoms of the at least one first element and vacancies adjacent to the threefold coordinated atoms of the at least one first element are aligned with a [111] direction at a rate of 95% or more.

3. The diamond substrate according to claim 1, further comprising:
an oxide layer provided on the surface of the diamond layer.

4. The diamond substrate according to claim 3, further comprising:
a region located between the diamond layer and the oxide layer, the region including at least one second element selected from the group consisting of N, P, As, Sb and Bi.

5. The diamond substrate according to claim 4, wherein a concentration distribution of the at least one second element in the diamond layer, the region, and the oxide layer has a peak in the region.

6. The diamond substrate according to claim 1,
wherein a concentration of the at least one first element in the diamond layer is equal to or greater than $1\times10^{18}$ cm$^{-3}$ and equal to or less than $1\times10^{22}$ cm$^{-3}$.

7. A quantum device comprising the diamond substrate according to claim 1.

8. A quantum system comprising the diamond substrate according to claim 1.

9. The diamond substrate according to claim 1,
wherein a percentage of the threefold coordinated atoms of the at least one first element among the at least one first element included in the diamond layer is equal to or greater than 95%.

10. The diamond substrate according to claim 1 further comprising:
a base layer made of diamond, the diamond layer provided on the base layer.

11. A diamond substrate comprising:
a diamond layer including at least one first element selected from the group consisting of nitrogen (N), phosphorus (P), arsenic (As), antimony (Sb), and bismuth (Bi), the diamond layer having a first bonding structure and a second bonding structure, the first bonding structure having the at least one first element and hydrogen bonded to the at least one first element, the second bonding structure having the at least one first element and four carbon atoms bonded to the at least one first element, the number of first bonding structures being larger than the number of second bonding structures, a surface of the diamond layer having an off angle of 10 degrees or less with respect to a (111) face.

12. The diamond substrate according to claim 11,
wherein directions connecting the at least one first element and the hydrogen are aligned with a [111] direction at a rate of 95% or more.

13. The diamond substrate according to claim 11, further comprising:
an oxide layer provided on the surface of the diamond layer.

14. The diamond substrate according to claim 13, further comprising:
a region located between the diamond layer and the oxide layer, the region including at least one second element selected from the group consisting of N, P, As, Sb and Bi.

15. The diamond substrate according to claim 14,
wherein a concentration distribution of the at least one second element in the diamond layer, the region, and the oxide layer has a peak in the region.

16. The diamond substrate according to claim 7,
wherein a concentration of the at least one first element in the diamond layer is equal to or greater than $1\times10^{18}$ cm$^{-3}$ and equal to or less than $1\times10^{22}$ cm$^{-3}$.

* * * * *